(12) United States Patent
Kim (10) Patent No.: US 7,550,312 B2
(45) Date of Patent: Jun. 23, 2009

(54) IMAGE SENSOR (75) Inventor: Sang Sik Kim, Gyeonggi-do (KR)

(73) Assignee: Dongbu HiTek Co., Ltd., Seoul (KR)

(*) Notice: Subject to any disclaimer, the term of this patent is extended or adjusted under 35 U.S.C. 154(b) by 176 days.

(21) Appl. No.: 11/616,825

(22) Filed: Dec. 27, 2006

(65) Prior Publication Data

US 2007/0148373 A1    Jun. 28, 2007

(30) Foreign Application Priority Data

Dec. 28, 2005    (KR) .................. 10-2005-0131366

(51) Int. Cl.
*H01L 21/00* (2006.01)
(52) U.S. Cl. .................. 438/57; 438/71; 438/72; 257/232; 257/291
(58) Field of Classification Search .......... 438/57, 438/60, 70–75, 144–145; 257/232–234, 257/290–294, 440, E27.13
See application file for complete search history.

(56) References Cited

U.S. PATENT DOCUMENTS 5,025,133 A * 6/1991 Tsutahara et al. ........ 219/444.1
6,171,883 B1    1/2001 Fan et al.
2004/0147059 A1 * 7/2004 Jeong et al. .................. 438/70

\* cited by examiner

*Primary Examiner*—Ha Tran T Nguyen
*Assistant Examiner*—Daniel Whalen
(74) *Attorney, Agent, or Firm*—Sherr & Vaughn, PLLC (57) ABSTRACT

Embodiments relate to an image sensor and a method of manufacturing an image sensor. In embodiments, the method may include preparing a semiconductor substrate formed with a plurality of photodiodes, forming an interlayer dielectric layer on the semiconductor substrate, forming a color filter layer on the interlayer dielectric layer, forming a planar layer on the color filter layer, and forming micro-lenses on the planar layer by using heat transfer liquid. Heat is uniformly applied to the micro-lens because the micro-lens is immersed in the heat transfer liquid having the high temperature, so the micro-lenses are prevented from being bonded to each other. Since a curvature surface of the micro-lens may be uniformly formed, the photo-sensitivity and color reproduction of the image sensor may be improved, which may result in a high-quality image sensor.

15 Claims, 7 Drawing Sheets

IMAGE SENSOR

The present application claims priority under 35 U.S.C. 119 and 35 U.S.C. 365 to Korean Patent Application No. 10-2005-0131366 (filed on Dec. 28, 2005), which is hereby incorporated by reference in its entirety.

BACKGROUND

An image sensor may be a semiconductor device that may convert optical images into electric signals, and may be mainly classified into a charge coupled device (CCD) image sensor and a CMOS image sensor.

Such an image sensor may include a photodiode that may detect light. The image sensor may further include a logic circuit that may convert detected light into electric signals. The detected light may thereby be represented as data. As an amount of light received in the photodiode increases, the photo sensitivity of the image sensor may improve.

Photo sensitivity may be improved by various methods. For example, a fill factor, which may be a ratio of a photodiode area to the whole area of the image sensor, may be increased. Alternatively, photo-gathering technology may be used to change a path of light incident onto an area other than the photodiode area such that the light may be gathered in the photodiode.

A micro-lens is an example of the photo-gathering technology. For example, a convex micro-lens may be formed on a top surface of a photodiode. The micro-lens may be formed using a material having superior light transmittance. The micro-lens may refract a path of incident light in such a manner that a greater amount of light may be transmitted into the photo-diode area. Hence, light parallel to an optical axis of the micro-lens may be refracted by the micro-lens, and light may be focused at a specific position on the optical axis.

A related art image sensor may include various components, such as a photodiode, an interlayer dielectric layer, a color filter, a micro-lens, and so on.

An interlayer dielectric layer may be formed on a semiconductor substrate formed with a plurality of photodiodes. RGB color filter layers may be formed on the interlayer dielectric layer and may correspond (i.e. be aligned) with the photodiodes, respectively.

A planar layer may be formed on the color filter layers and may planarize an irregular surface that may occur on the color filter layers. In addition, micro-lenses may be formed on the planar layer to correspond with the photodiodes and the color filter layers, respectively.

The photodiode may detect light and may convert the light into an electric signal. The interlayer dielectric layer may insulate metal interconnections from each other. The color filter may exhibit the three primary colors of red, green, and blue (R, G, B). The micro-lens may guide the light onto the photodiode.

FIGS. 1A to 1D illustrate a related art method of manufacturing a micro-lens.

Figure 1A:
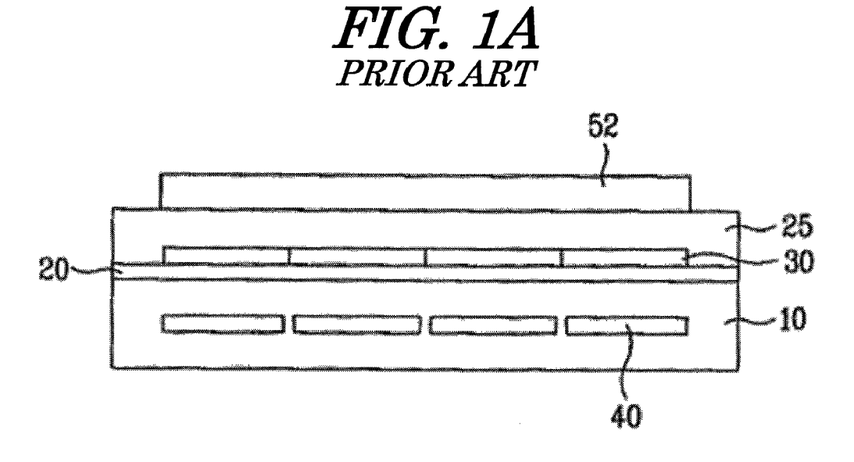
FIGS. 1A to 1D are example diagrams illustrating a procedure for forming a related art micro-lens.

Referring to FIG. 1A, micro-lens layer 52 may be formed on semiconductor substrate 10 on which a plurality of photodiodes 40, interlayer dielectric layer 20, a color filter layer 30, and planar layer 25 may be formed.

Figure 1B:
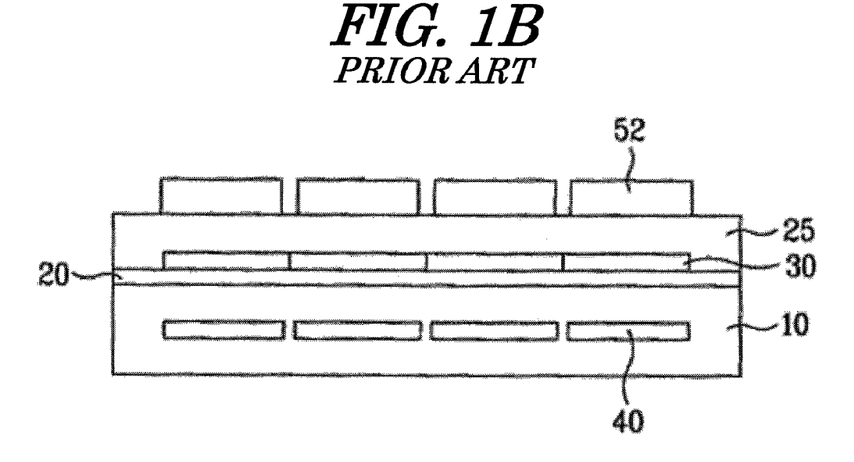

Referring to FIG. 1B, micro-lens layer 52 may be patterned such that a micro-lens pattern may correspond to locations of to photodiodes 40.

Figure 1C:
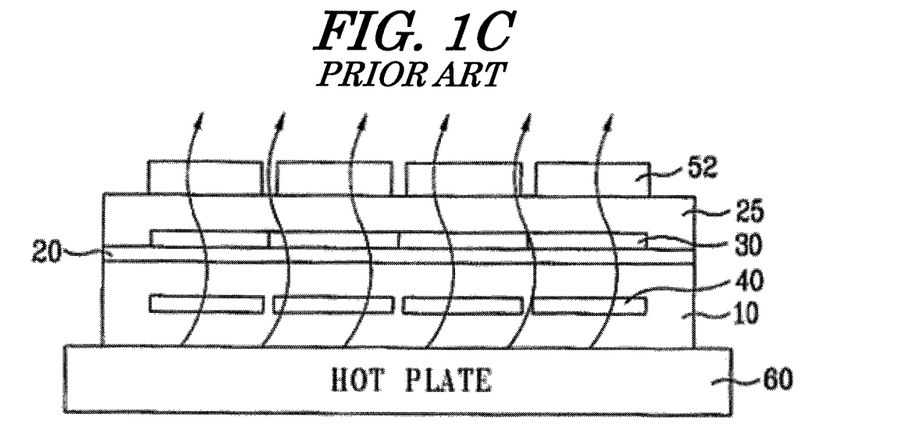

Referring to FIG. 1C, semiconductor substrate 10 may be loaded on hot plate 60 and heat may be applied to semiconductor substrate 10. Accordingly, the micro-lens may be formed.

Figure 1D:
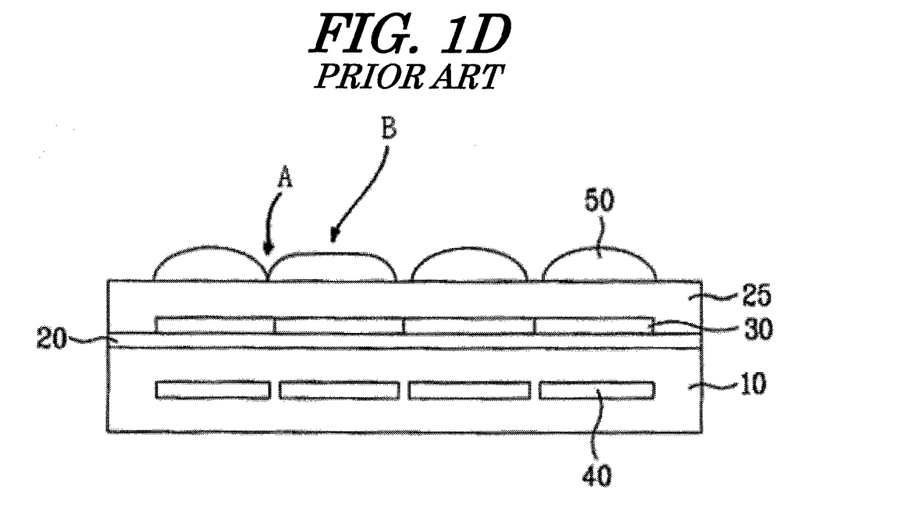

Referring to FIG. 1D, as illustrated in portions A and B, micro-lens 50 of the image sensor manufactured through the related art method may have an irregular surface.

If heat is directly applied to semiconductor substrate 10, which may be formed with micro-lens layer 52 and may be loaded on hot plate 60, the heat transfer coefficient or heat capacity may be locally uneven depending on the heat transfer route formed below micro-lens layer 52, or the heat transfer rate may be locally uneven due to the step difference. This may result in irregular heat transfer may occur, which may cause micro-lens 50 to have an irregular surface.

That is, adjacent micro-lenses 50 may be bonded to each other (see, A of FIG. 1D), or a curvature surface of micro-lens 50 may be distorted or crushed (see, B of FIG. 1D). This may negatively affect pixels adjacent to micro-lens 50 and may degrade a focusing efficiency of a micro-lens.

SUMMARY

Embodiments relate to an image sensor. Embodiments relate to a method of manufacturing an image sensor that may be capable of forming a uniform micro-lens.

Embodiments relate to a method of manufacturing an image sensor that may be capable of forming a uniform micro-lens by performing a process of forming a curvature surface of the micro-lens in heat transfer liquid.

In embodiments, a method of manufacturing an image sensor may include preparing a semiconductor substrate formed with a plurality of photodiodes, forming an interlayer dielectric layer on the semiconductor substrate, forming a color filter layer on the interlayer dielectric layer, forming a planar layer on the color filter layer, and forming micro-lenses on the planar layer by using heat transfer liquid.

In embodiments, forming the micro-lens on the planar layer may include forming a micro-lens layer on the planar layer, patterning the micro-lens layer formed on the planar layer, and immersing the semiconductor substrate including the patterned micro-lens layer in the heat transfer liquid having a high temperature, thereby forming a curvature surface of the micro-lens.

In embodiments, forming the micro-lens on the planar layer may include forming a micro-lens layer on the planar layer, patterning the micro-lens layer formed on the planar layer, forming a protective layer on the patterned micro-lens layer and immersing the semiconductor substrate including the patterned micro-lens layer in the heat transfer liquid having a high temperature, thereby forming a curvature surface of the micro-lens.

In embodiments, mercury (Hg) may be used as the heat transfer liquid when the micro-lens may be formed on the planar layer. In embodiments, forming the micro-lens using mercury (Hg) may be performed in a temperature range of 200° C. to 250° C.

DETAILED DESCRIPTION OF EMBODIMENTS

Figure 2A:
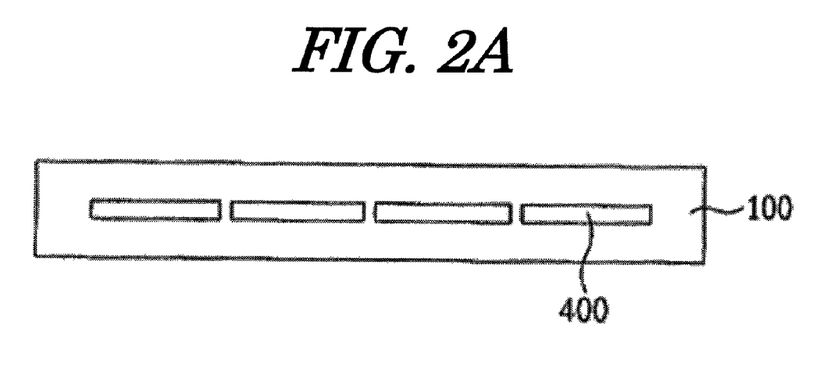
FIGS. 2A to 2E are example diagrams illustrating a micro-lens and a procedure for manufacturing an image sensor according to embodiments.

Referring to FIG. 2A, semiconductor substrate 100 may be formed with a plurality of photodiodes 400.

Figure 2B:
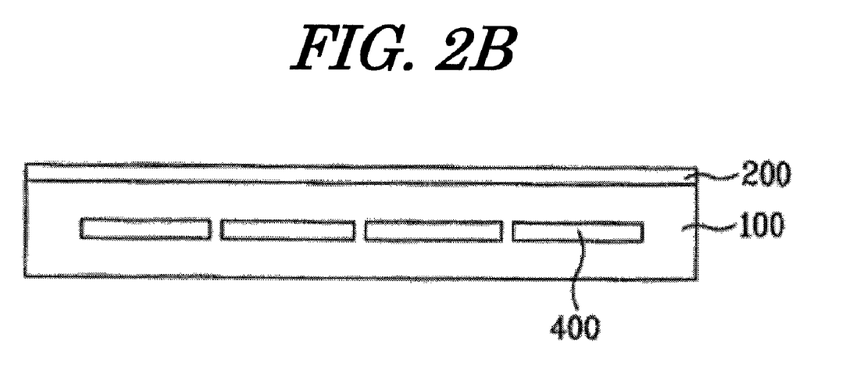

Referring to FIG. 2B, interlayer dielectric layer 200 may be formed on semiconductor substrate 100 including photodiodes 400. Interlayer dielectric layer 200 may include SiN or SiON.

Figure 2C:
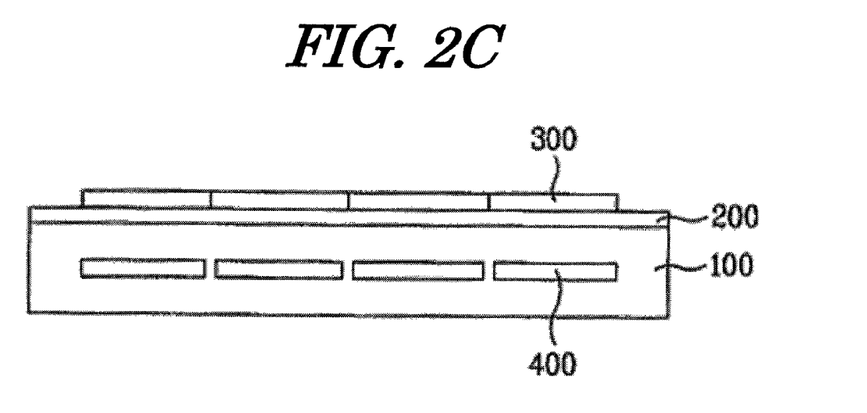

Referring to FIG. 2C, color filter layers 300 may be formed on interlayer dielectric layer 200. In embodiments, color filter layers 300 may be aligned corresponding to locations of photodiodes 400, respectively.

Figure 2D:
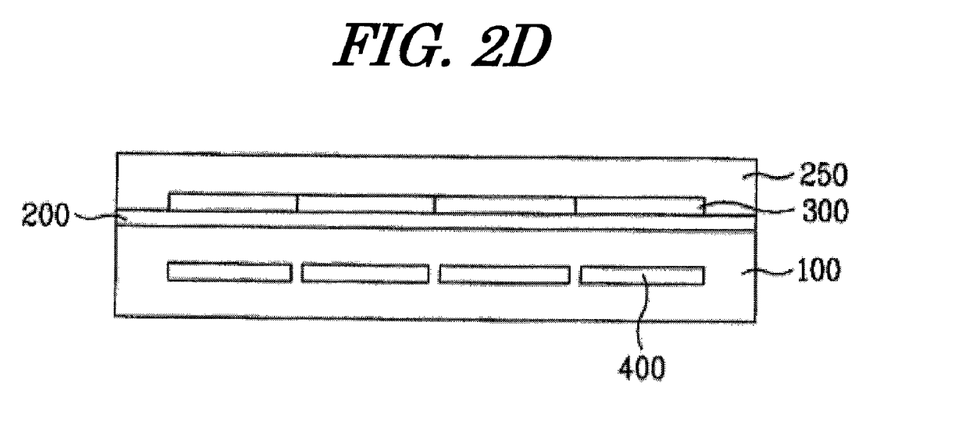

Referring to FIG. 2D, planar layer 250 may be formed on color filter layer 300. Planar layer 250 may include organic materials that may have a thickness of about 0.5 µm to 1.5 µm. Planar layer 250 may have superior transparency in a visible spectrum, and may effectively protect color filter layers 300. In embodiments, it may be relatively easy to form the micro-lens (not shown) on planar layer 250, and to adjust the focal length.

Figure 2E:
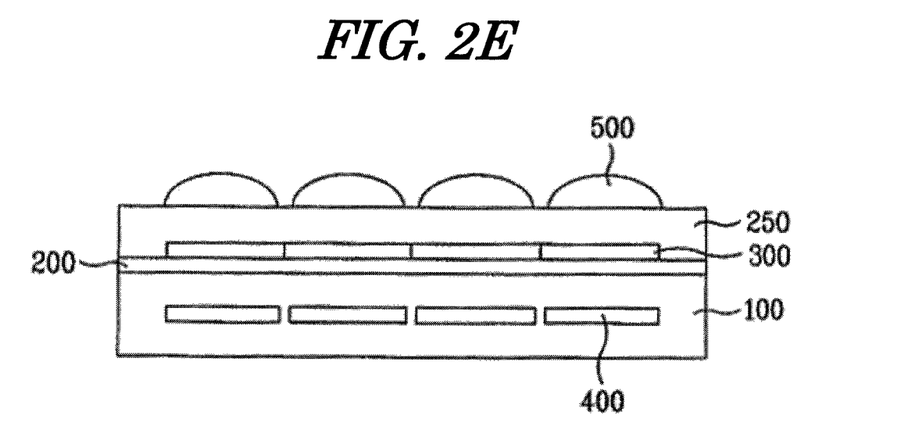

Referring to FIG. 2E, micro-lenses 500 may be formed on planar layer 250, thereby obtaining the image sensor. In embodiments, micro-lenses 500 may be aligned to correspond to locations of photodiodes 400 and color filter layers 300, respectively. Micro-lens 500 may include a photoresist or a material having insulating property that may allow light to transmit therethrough.

Figure 3A:
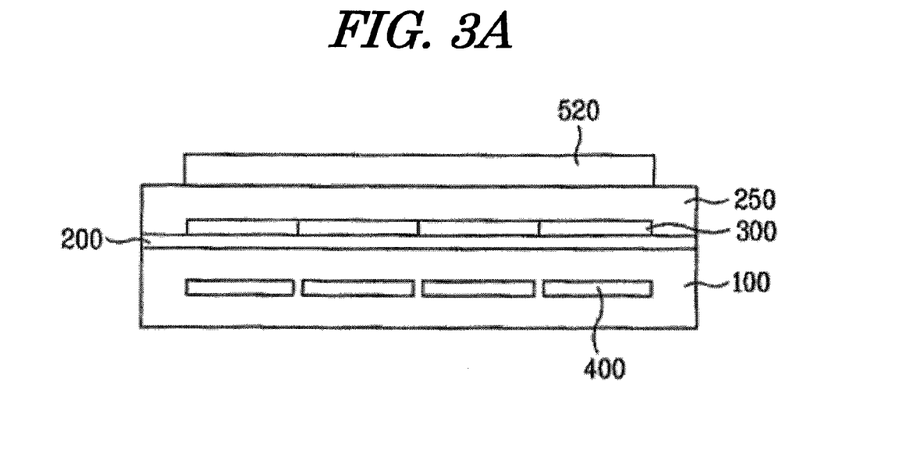
FIGS. 3A to 3D are example diagrams illustrating a micro-lens and a procedure for manufacturing a micro-lens according to embodiments.

Referring to FIG. 3A, micro-lens layer 520 may be formed on a semiconductor substrate 100. Semiconductor substrate 100 may include a plurality of photodiodes 400, interlayer dielectric layer 200, color filter layer 300, and planar layer 250.

Figure 3B:
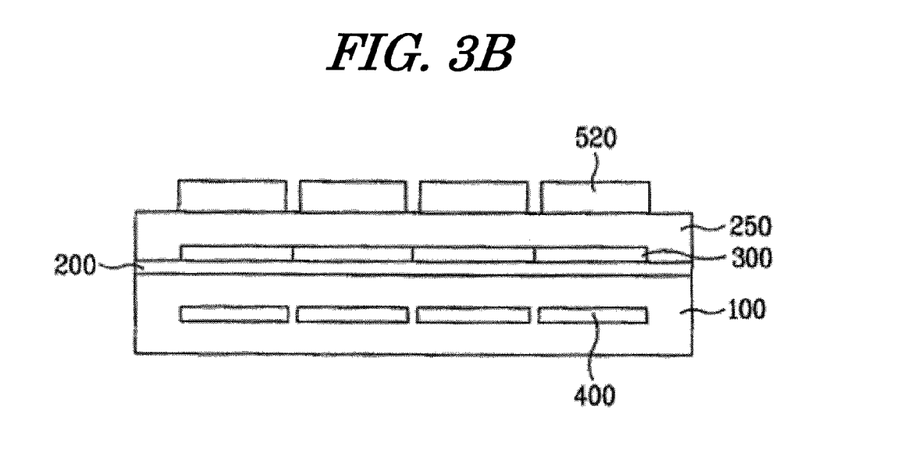

Referring to FIG. 3B, micro-lens layer 520 may be patterned such that the micro-lens pattern may aligned to correspond to locations of photodiodes 400.

According to embodiments, a protective layer may be formed on patterned micro-lens layer 520.

In embodiments, the process of forming the protective layer may be omitted. However, if heat transfer liquid used in the subsequent process can react with micro-lens layer 520, it may be necessary to form the protective layer on micro-lens layer 520 so as to protect micro-lens layer 520, in embodiments.

Figure 3C:
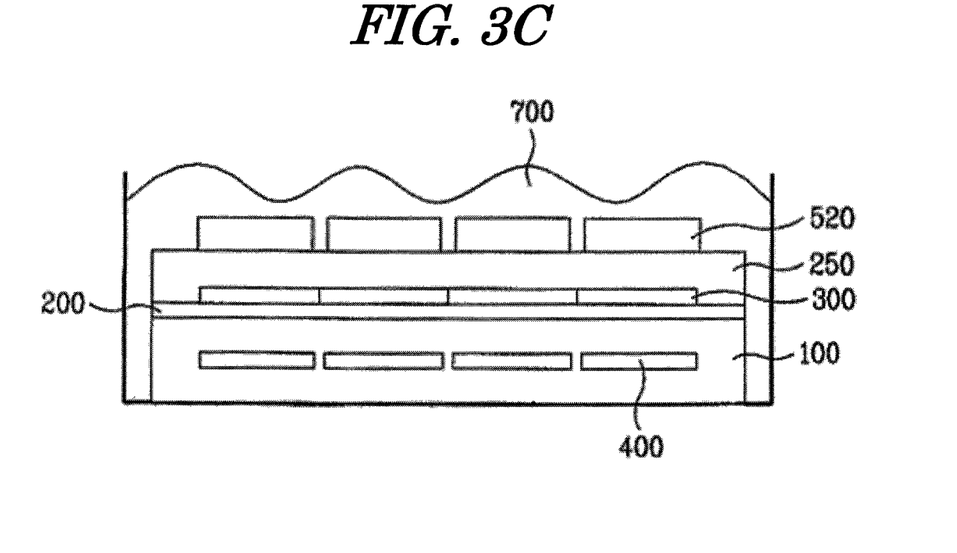

Referring to FIG. 3C, semiconductor substrate 100, which may include patterned micro-lens layer 520, may be immersed in heat transfer liquid 700, which may have a relatively high temperature. This may cause a curvature surface to be formed on the micro-lens 520.

Figure 3D:
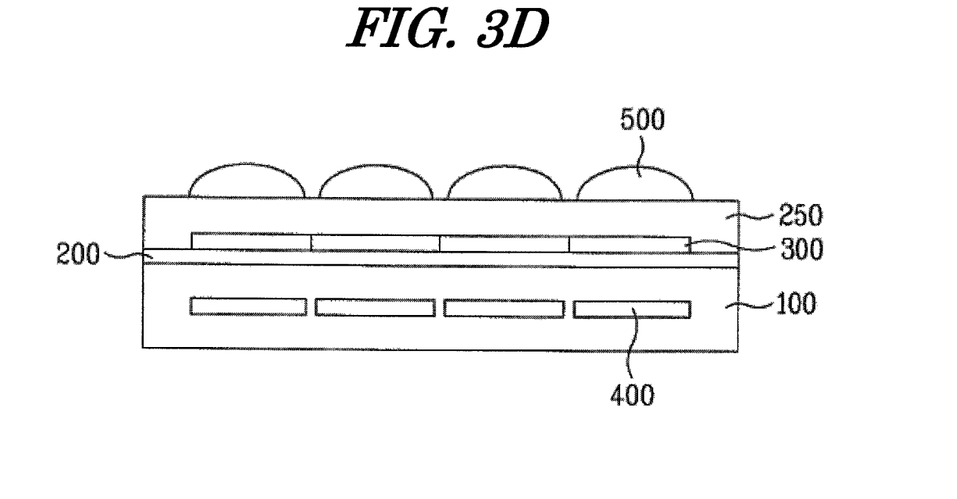

Referring to FIG. 3D, the image sensor may be obtained, according to embodiments.

According to embodiments, due to the interfacial tension occurring between heat transfer liquid 700 and micro-lens layer 520, the curvature surface of the micro-lens may be uniformly formed without being crushed.

In embodiments, micro-lens layer 520 immersed in heat transfer liquid 700, that may have a high temperature, may not be bonded to the adjacent micro-lens layer 520 due to gravity and liquid pressure. Accordingly, the micro-lens 500 having the uniform curvature surface may be obtained.

According to embodiments, mercury (Hg) may be used as heat transfer liquid 700.

In embodiments, a process for forming the micro-lens may be performed at a temperature of 200° C. or more. This is because mercury (Hg) has a melting point in a range of 200° C. to 300° C., so mercury (Hg) may be maintained in a liquid phase at the temperature of 200° C. or more.

A uniform curvature surface may be obtained by the interfacial tension when heat transfer liquid 700 does not lose its liquid phase at the temperature of 200° C. or more. Thus, mercury (Hg) having the temperature of 200° C. to 250° C. may be used as heat transfer liquid 700.

In embodiments, since mercury (Hg) may represent low specific heat, it is preferred to heat mercury (Hg) several times to allow mercury (Hg) to be maintained at the temperature of 200° C. to 250° C.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   preparing a semiconductor substrate having a plurality of photodiodes;
   forming an interlayer dielectric layer over the semiconductor substrate;
   forming a color filter layer over the interlayer dielectric layer;
   forming a planar layer over the color filter layer; and
   forming a micro-lens layer over the planar layer;
   patterning the micro-lens layer to form a patterned micro-lens layer; and
   forming micro-lenses by immersing the semiconductor substrate including the patterned micro-lens layer in the heat transfer liquid.

2. The method of claim 1, wherein the heat transfer liquid is heated to approximately 200° C. to 250° C.

3. The method of claim 2, wherein the heat transfer liquid comprises mercury (Hg).

4. The method of claim 1, wherein mercury (Hg) is used as the heat transfer liquid.

5. The method of claim 4, wherein the mercury (Hg) is heated to a temperature range of 200° C. to 250° C. prior to immersing the semiconductor substrate in the mercury.

6. The method of claim 1, wherein the planar layer comprises an organic material.

7. The method of claim 6, wherein the planar layer has a thickness of approximately 0.5 µm to 1.5 µm.

8. A method, comprising:
   forming a planar layer over a semiconductor substrate, the semiconductor substrate having a plurality of photodiodes formed thereon;
   forming a patterned micro-lens layer over the planar layer; and forming micro-lenses over the planar layer by immersing the patterned micro-lens layer in a heat transfer liquid heated to a predetermined temperature.

9. The method of claim 8, wherein the heat transfer liquid comprises mercury (Hg) heated to a temperature of at least 200° C.

10. The method of claim 9, further comprising:
    forming an interlayer dielectric layer over the semiconductor substrate;
    forming a color filter layer over the interlayer dielectric layer; and
    forming the planar layer over the color filter layer, wherein the planar layer comprises an organic material having a thickness of approximately 0.5 µm to 1.5 µm.

11. A method comprising:
providing a semiconductor substrate having a plurality of photodiodes;
forming a color filter layer over the semiconductor substrate including the photodiodes;
forming a patterned micro-lens layer over the color filter layer;
forming micro-lenses over the color filter layer by immersing the patterned micro-lens layer in a heat transfer liquid heated to a predetermined temperature.

12. The method of claim 11, wherein the predetermined temperature is in a range between approximately 200° C. to 250° C.

13. The method of claim 12, wherein the heat transfer liquid comprises mercury (Hg).

14. The method of claim 11, wherein the heat transfer liquid is heated to the predetermined temperature prior to immersing the patterned micro-lens layer in the heat transfer liquid.

15. The method of claim 11, wherein the heat transfer liquid comprises mercury (Hg).

* * * * *